United States Patent [19]
Cutter et al.

[11] Patent Number: 6,154,410
[45] Date of Patent: Nov. 28, 2000

[54] METHOD AND APPARATUS FOR REDUCING ANTIFUSE PROGRAMMING TIME

[75] Inventors: Douglas J. Cutter, Fort Collins, Colo.; Kurt D. Beigel, Boise, Id.; Adrian E. Ong, Pleasanton; Fan Ho, San Ramon, both of Calif.; Patrick J. Mullarkey, Meridian, Id.; Dien Luong, Boise, Id.; Brett Debenham, Meridian, Id.; Kim Pierce, Meridian, Id.

[73] Assignee: Micron Technology, Inc., Boise, Id.

[21] Appl. No.: 08/795,531

[22] Filed: Feb. 5, 1997

[51] Int. Cl.⁷ .................................................. G11C 7/00
[52] U.S. Cl. ............................................ 365/225.7; 365/96
[58] Field of Search .................................. 365/225.7, 96; 257/530, 739; 327/525, 526; 326/38, 10; 438/131, 467

[56] References Cited

U.S. PATENT DOCUMENTS

| 5,301,143 | 4/1994 | Ohri .................................... 365/225.7 |
| 5,301,159 | 4/1994 | Lee ...................................... 365/225.7 |
| 5,753,540 | 5/1998 | Wu et al. ............................... 438/131 |

*Primary Examiner*—A. Zarabian
*Attorney, Agent, or Firm*—Fletcher, Yoder & Van Someren

[57] ABSTRACT

Method and apparatus are disclosed for reducing antifuse programming time by connecting the programming voltage to the electrode of the antifuse element that has roughened polysilicon.

12 Claims, 2 Drawing Sheets

METHOD AND APPARATUS FOR REDUCING ANTIFUSE PROGRAMMING TIME

BACKGROUND OF THE INVENTION

1. Field of the Invention

The present invention relates to integrated circuit products and, more particularly, to a method and apparatus for reducing the programming time for antifuse elements in such products.

2. Description of the Prior Art

Contemporary memory products require a high degree of redundancy in order to improve manufacturing yields. Present redundancy techniques in memories include providing extra columns and/or extra rows in the memory arrays. These extra columns and rows can be used to replace defective columns, rows, or single bit failures.

Antifuses have been used as nonvolatile programmable memory elements to store logic states used in memories for row and column redundancy implementation. An antifuse is a device that functions as an open circuit until programmed. By way of example, antifuses for redundancy implementation on a dynamic random access memory ("DRAM") are usually constructed in the same manner as the memory cell capacitors in the DRAM array. When programmed, an antifuse creates a short circuit or low resistance link, thereby enabling the particular redundant row, column, or memory location.

Antifuses have other uses in integrated circuit products besides redundancy implementation. Antifuses may, for example, be used in integrated circuits as a mechanism for changing an operating mode. Likewise, antifuses may be programmed to encode identification information about the integrated circuit, such as when the integrated circuit was fabricated.

A semiconductor die often contains a plurality of antifuse elements as shown, for example, in U.S. Pat. No. 5,301,143, which is assigned to the assignee of the present invention and which is incorporated herein by reference for all purposes. Additionally, the number of antifuses in a DRAM has increased as the density of DRAMs has increased. For example, a 4 M DRAM may have over 100 antifuses, while a 64 M DRAM may have over 1600 antifuses. For this reason, the time that is required to program the antifuses in a DRAM has increased. Accordingly, a method and apparatus for reducing antifuse programming time would be beneficial.

The present invention is directed to overcoming, or at least reducing the affects of, one or more of the problems set forth above.

SUMMARY OF THE INVENTION

In accordance with one aspect of the present invention, there is provided a method of programming an antifuse element that has a roughened polysilicon electrode and a non-roughened polysilicon electrode. The method includes the steps of applying a programming voltage to the roughened polysilicon electrode, and grounding the non-roughened polysilicon electrode.

In accordance with another aspect of the present invention, there is provided antifuse circuit that includes an antifuse element having a roughened polysilicon layer and a non-roughened polysilicon layer. A dielectric layer is interposed between the roughened polysilicon layer and the non-roughened polysilicon layer. A first conductor is coupled to the roughened polysilicon layer, and the first conductor is coupled to receive a programming voltage. A second conductor is coupled to the non-roughened polysilicon layer, and the second conductor is coupled to receive a reference voltage.

In accordance with yet another aspect of the present invention, there is provided a semiconductor die. The die includes a plurality of antifuse circuits. At least a portion of said plurality of antifuse circuits included an antifuse element having a roughened polysilicon member and a non-roughened polysilicon member. Circuitry operatively couples a programming voltage to the roughened polysilicon member, and circuitry operatively couples a reference voltage to the non-roughened polysilicon member.

In accordance with a further aspect of the present invention, there is provided a memory circuit that includes a plurality of memory cells. An antifuse element is coupled to one of the plurality of memory cells. The antifuse element has a smooth conductive member and a roughened conductive member. A dielectric material is disposed between the smooth conductive member and the roughened conductive member. The roughened conductive member is coupled to receive a voltage for programming the antifuse element.

In accordance with still another aspect of the present invention, there is provided a memory circuit that includes a memory array arranged in rows and columns. The array has a plurality of redundant rows. At least one antifuse element is coupled to one of the plurality of redundant rows. The antifuse element has a smooth conductive member and a roughened conductive member. A dielectric material is disposed between the smooth conductive member and the roughened conductive member. The roughened conductive member is coupled to receive a voltage for programming the antifuse element.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

Figure 1:
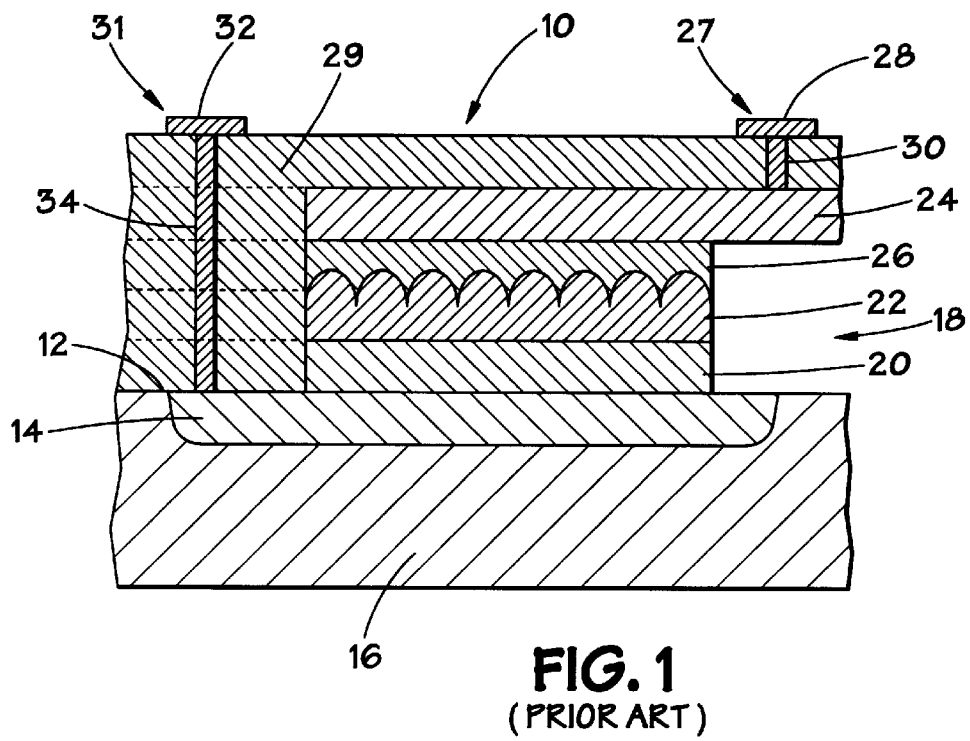
FIG. 1 is a cross-sectional view depicting the structure of an antifuse element that has been used in DRAMS.
Figure 2:
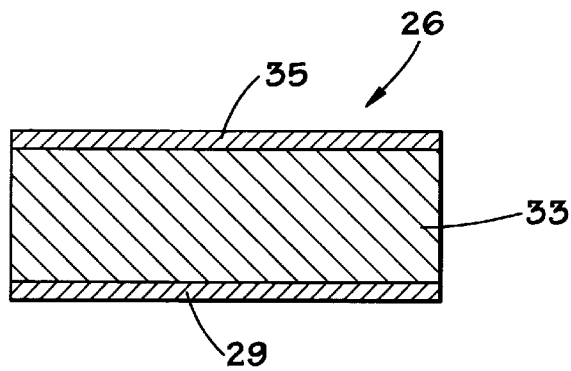
FIG. 2. is a cross-sectional view of the dielectric of the antifuse element of FIGS. 1 and 3.

Turning now to the drawings and referring initially to FIG. 1, there is depicted a cross-sectional view of the structure of a conventional antifuse element generally identified by the reference numeral 10. The antifuse element 10 includes a bottom plate 12 made of an impurity region 14 that is formed in a semiconductor substrate 16. The impurity region 14 is typically an n+ region formed by diffusion or implantation. The antifuse element 10 also includes a lower polysilicon element 18 formed on the bottom plate 12. The lower polysilicon element 18 is composed of a planar polysilicon layer 20 and a layer of hemispherical grained polysilicon 22, typically referred to as "HSG poly" or "roughened poly," that are formed on top of and in electrical contact with the impurity region 14. The antifuse element 10 also includes an upper polysilicon layer 24. Interposed between the lower polysilicon element 18 and the upper polysilicon layer 24 is a dielectric layer 26. The dielectric layer 26 typically includes a native oxide layer 29, a silicon nitride layer 33, and an oxide layer 35, as shown in FIG. 2. The native oxide layer 29 is approximately 8–12 angstroms thick, the silicon nitride layer 33 is about 80 angstroms thick, and the upper oxide layer 35 is about 4 angstroms thick.

A programming voltage is applied to an electrode 27. The electrode 27 includes a metal line 28 that is connected via a contact 30 to the upper polysilicon layer 24. A ground potential is applied to another electrode 31. The electrode 31 includes a metal line 32 that is connected to the impurity region 14 via a contact 34 as shown in FIG. 1. The electrodes 27 and 31 are isolated by an insulator or dielectric 29. Thus, conventionally, the programming voltage for the antifuse element 10 is always applied to the electrode 27 which is coupled to the non-roughened upper polysilicon layer 24.

Figure 3:
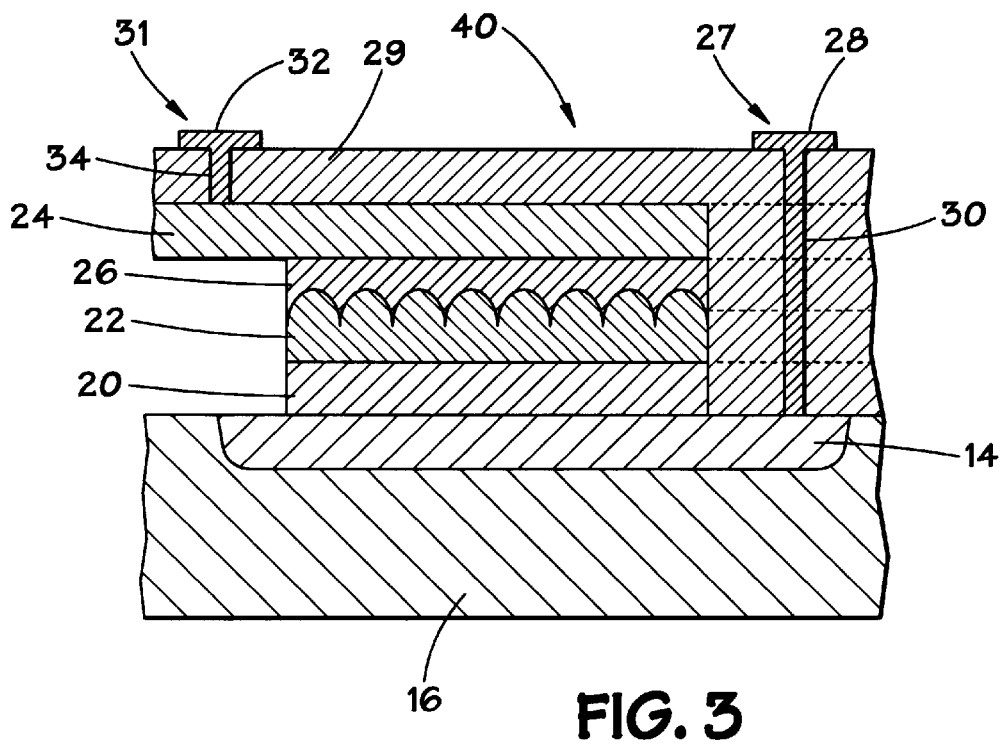
FIG. 3 is a cross-sectional view depicting structure of an antifuse element in accordance with the present invention.
Figure 4:
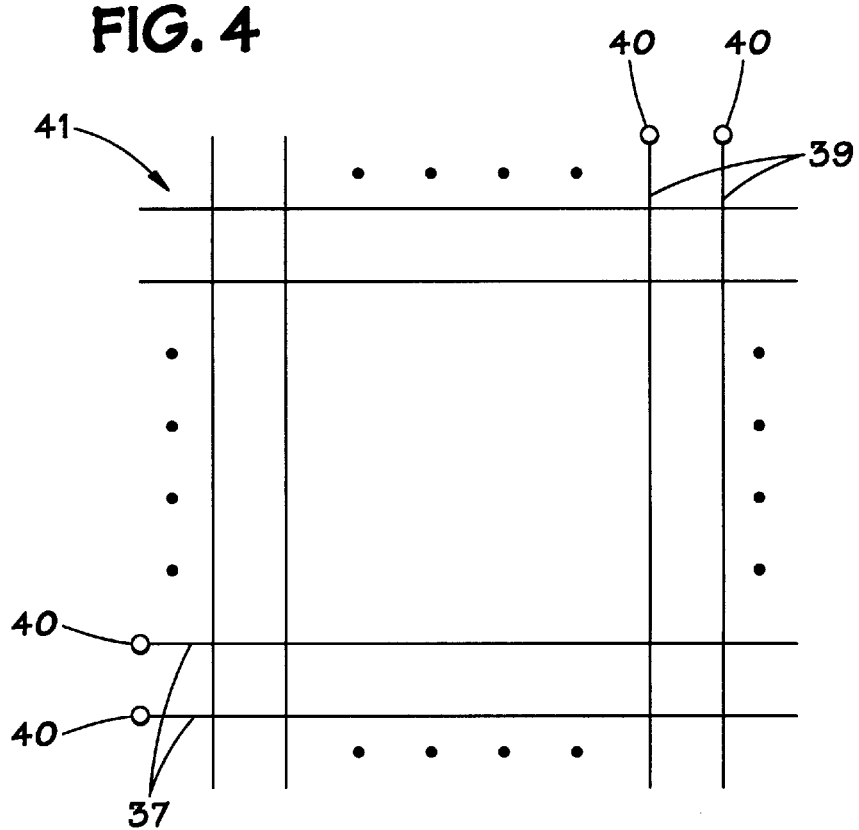
FIG. 4 is a diagrammatic view of a memory array having redundant rows and columns with antifuses in accordance with the present invention.

With reference to FIG. 3, an antifuse element 40 in accordance with the present invention is illustrated. However, before discussing the detailed structure of the antifuse element 40, it should be understood that the antifuse element 40 is typically used to enable redundant rows 37 and/or columns 39 of a memory array 41, as illustrated in FIG. 4. The circuitry used to access and program the antifuse elements 40 is known in the art, so it will not be described herein.

For ease of illustration and discussion, similar elements will be numbered with like reference numerals in FIGS. 1 and 3. The planar or smooth polysilicon layer 20, together with the roughened polysilicon layer 22, are typically about 300 to 500 angstroms thick. The dielectric layer 26 is typically about 80 to 100 angstroms thick. The planar or smooth polysilicon layer 24 is typically about 300 to 500 angstroms thick.

The antifuse element 40 differs from the antifuse cell 10 of FIG. 1 in at least two ways. First, in FIG. 3, the electrode 27 for receiving the programming voltage $V_{pp}$ is connected to the impurity region 14 in the substrate 16. Second, the electrode 31 for receiving the ground potential is connected to the upper polysilicon layer 24 which forms the top plate of the antifuse element 40. The mask layers that are used to pattern the structure depicted in FIG. 1 are modified to permit fabrication of strutcture depicted in FIG. 3.

Figure 5:
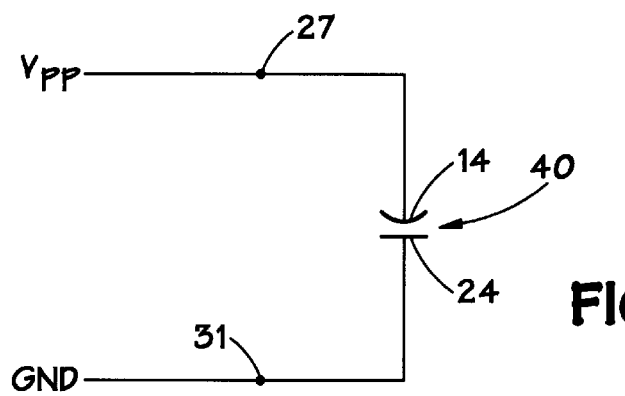
FIG. 5 is an schematic diagram depicting application of a programming voltage to an antifuse element in accordance with the present invention.

Since the impurity region 14 in the antifuse element 40 is in electrical contact with the roughened polysilicon layer 22, the programming voltage $V_{pp}$, which may have a value of about +12 volts, is applied to the roughened polysilicon layer 22 via the electrode 27. FIG. 5 schematically illustrates these connections. For reasons not wholly understood by the inventors, the speed of programming of the antifuse element 40 is substantially increased as compared to the antifuse element 10 by applying the programming voltage to the electrode 27 of the antifuse element 40 that is connected to the roughened polysilicon layer 22.

As illustrated by the table below, the time that it takes to program the antifuse element 40 has been reduced by greater than a factor of ten as compared with the time that it takes to program the conventional antifuse element 10. The electrodes of the antifuse elements 10 and 40 may have more than one contact. Therefore, the table below includes data for antifuse elements 10 and 40 having one, two, and four contacts.

| Time to Blow Test Structure | | |
|---|---|---|
| Number of Contacts | Conventional Antifuse 10 | Antifuse 40 |
| 1 | 169 μs | 12 μs |
| 2 | 110 μs | 25 μs |
| 4 | 57 μs | 16 μs |
| 1 | 173 | 9 |
| 2 | 127 | 6 |
| 4 | 15 | 20 |
| 1 | 98 | 7 |
| 2 | 200 | 23 |
| 4 | 600 | 13 |
| 1 | 258 | 12 |
| 2 | 34 | 28 |
| 4 | 400 | 16 |
| 1 | 288 | 12 |
| 2 | 104 | 21 |
| 4 | 90 | 7 |
| 1 | 352 | 13 |
| 2 | 258 | 3 |
| 4 | 198 | 57 |
| | 196.2 μs | 16.7 μs |

While the antifuse 40, on average, blows much quicker than the conventional antifuse 10, it should be noted that in certain circumstances tests have revealed that the conventional antifuse 10 may blow faster than the antifuse 40. It is believed that defects in the conventional antifuse 10 and/or the antifuse 40 tested lead to this seemingly anomalous result.

While the invention is susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the appended claims.

What is claimed is:

1. A method of programming an antifuse element that has a roughened polysilicon electrode and a non-roughened polysilicon electrode, the method comprising the steps of:

applying a programming voltage to the roughened polysilicon electrode; and grounding the non-roughened polysilicon electrode.

2. An antifuse circuit, comprising:

an antifuse element having a roughened polysilicon layer and a non-roughened polysilicon layer;

a dielectric layer being interposed between said roughened polysilicon layer and said non-roughened polysilicon layer;

a first conductor coupled to said roughened polysilicon layer, said first conductor coupled to receive a programming voltage; and a second conductor coupled to said non-roughened polysilicon layer, said second conductor coupled to receive a reference voltage.

3. A semiconductor die comprising:

a plurality of antifuse circuits, at least a portion of said plurality of antifuse circuits comprising:

an antifuse element having a roughened polysilicon member and a non-roughened polysilicon member;

circuitry for operatively coupling a programming voltage to said roughened polysilicon member; and circuitry for operatively coupling a reference voltage to said non-roughened polysilicon member.

4. A memory circuit comprising:

a plurality of memory cells; and an antifuse element coupled to one of said plurality of memory cells, said antifuse element having a smooth conductive member and a roughened conductive member and having a dielectric material disposed between said smooth conductive member and said roughened conductive member, said roughened conductive member being coupled to receive a voltage for programming said antifuse element.

5. A memory circuit comprising:

a memory array arranged in rows and columns, said array having a plurality of redundant rows;

at least one antifuse element coupled to one of said plurality of redundant rows, said antifuse element having a smooth conductive member and a roughened conductive member and having a dielectric material disposed between said smooth conductive member and said roughened conductive member, said roughened conductive member being coupled to receive a voltage for programming said antifuse element.

6. A method of programming an anti-fuse element having a roughened electrode and a non-roughened electrode, the method comprising the acts of:

(a) applying a programming voltage to the roughened electrode; and (b) applying a reference voltage to the non-roughened electrode.

7. The method, as set forth in claim 6, wherein act (a) comprises the act of:

applying the programming voltage to the roughened electrode, the roughened electrode being made of polysilicon.

8. The method, as set forth in claim 6, wherein act (b) comprises the act of:

applying the reference voltage to the non-roughened electrode, the non-roughened electrode being made of polysilicon.

9. The method, as set forth in claim 6, wherein act (b) comprises the act of:

coupling the non-roughened electrode to circuit ground.

10. A method of fabricating a programmable anti-fuse element comprising the acts of:

(a) fabricating an antifuse element having a roughened electrode and a non-roughened electrode;

(b) coupling a first conductor to the roughened electrode, the first conductor being coupled to receive a programming voltage; and (c) coupling a second conductor to the non-roughened electrode, the second conductor being coupled to receive a reference voltage.

11. The method, as set forth in claim 10, wherein act (a) comprises the act of:

fabricating the roughened electrode from rough polysilicon and the non-roughened electrode from smooth polysilicon.

12. The method, as set forth in claim 10, wherein act (c) comprises the act of:

coupling the non-roughened electrode to circuit ground.

* * * * *